(12) United States Patent
Lee

(10) Patent No.: US 7,385,261 B2
(45) Date of Patent: Jun. 10, 2008

(54) EXTENDED DRAIN METAL OXIDE SEMICONDUCTOR TRANSISTOR AND MANUFACTURING METHOD THEREOF

(75) Inventor: Sang Bum Lee, Bupyeong-gu (KR)

(73) Assignee: Dongbu Electronics Co., Ltd., Seoul (KR)

( * ) Notice: Subject to any disclaimer, the term of this patent is extended or adjusted under 35 U.S.C. 154(b) by 111 days.

(21) Appl. No.: 11/320,615

(22) Filed: Dec. 30, 2005

(65) Prior Publication Data

US 2007/0018249 A1 Jan. 25, 2007

(30) Foreign Application Priority Data

Jul. 21, 2005 (KR) .................... 10-2005-0066432

(51) Int. Cl.
*H01L 29/78* (2006.01)
*H01L 21/336* (2006.01)

(52) U.S. Cl. ............... 257/387; 257/E21.431; 438/286; 438/301; 438/305

(58) Field of Classification Search ........... 438/286
See application file for complete search history.

(56) References Cited

U.S. PATENT DOCUMENTS

| | | | |
|---|---|---|---|
| 5,145,801 A * | 9/1992 | Chhabra | 438/397 |
| 6,090,670 A * | 7/2000 | Sandhu et al. | 438/286 |
| 6,358,799 B2 * | 3/2002 | Odanaka et al. | 438/267 |
| 6,362,060 B2 * | 3/2002 | Ahn et al. | 438/299 |
| 2004/0021179 A1 * | 2/2004 | Lee et al. | 257/368 |
| 2006/0138549 A1 * | 6/2006 | Ko | 257/368 |

* cited by examiner

*Primary Examiner*—Stephen W Smoot
(74) *Attorney, Agent, or Firm*—Lowe Hauptman Ham & Berner LLP

(57) ABSTRACT

A MOS transistor having an extended drain structure and including a semiconductor substrate formed in a well of a first conductivity type. A gate insulating layer is formed on the substrate, a gate electrode is formed on the gate insulating layer, and a source region is formed in a first portion of the substrate, which is near to one side of the gate insulating layer and the gate electrode. A drain region is formed in a second portion of the substrate, which is near to another side of the gate insulating layer and the gate electrode. The second portion is recessed from the surface of the substrate by a predetermined depth.

12 Claims, 6 Drawing Sheets

EXTENDED DRAIN METAL OXIDE SEMICONDUCTOR TRANSISTOR AND MANUFACTURING METHOD THEREOF

CROSS-REFERENCE TO RELATED APPLICATION

This application claims priority to and the benefit of Korean Patent Application No. 10-2005-0066432 filed in the Korean Intellectual Property Office on Jul. 21, 2005, the entire contents of which are incorporated herein by reference.

BACKGROUND OF THE INVENTION

1. Field of the Invention

The present invention relates to semiconductor technologies, and more specifically, to metal-oxide-semiconductor (MOS) transistors having an extended drain structure and fabrication method thereof.

2. Description of the Related Art

In semiconductor devices, MOS transistors having an extended drain structure have been developed to improve a breakdown voltage of the conventional transistors. The extended drain MOS transistors are widely used for high power devices.

Referring to FIG. 1, the conventional extended drain MOS transistor is explained in terms of its structure and fabrication method. In FIG. 1, an N-channel MOS transistor is shown.

Dopants of a first conductivity type (e.g., boron) are injected into a silicon semiconductor substrate 10 to form a P well 12. Then, a shallow trench isolation is formed to define field and active regions. In the active regions where electronic circuitries including MOS transistors are to be formed, a gate oxide and polysilicon are sequentially deposited on the substrate 10. Through a photolithographic process, the gate oxide and polysilicon are patterned to form a gate stack consisted of a gate insulating layer 14 and a gate electrode 16.

With the gate electrode 16 as a mask, the dopants having lower density and opposite charge to the P-channel well 12 (e.g., phosphorous or arsenic) are injected into the substrate to form lightly doped source region 22a and light doped drain region (LDD region) 24a.

After forming the regions 22a and 24a, insulating material is formed on the entire surface of the substrate 10 by low pressure chemical vapor deposition (LPCVD) and the deposited insulating material is selectively etched to leave material at the sidewalls of the gate electrode 16. The remaining insulating material forms a sidewall spacer 18 that enables the self-aligned process of the heavily doped drain region and electrically separates the gate electrode from the source/drain regions in subsequent salicide process.

With the gate electrode 16 and the sidewall spacer 18 as a mask, dopants having higher density and opposite charge to the P-channel well 12 (e.g., phosphorous or arsenic) are injected into the substrate 10 to form source/drain regions 22 and 24. In this process, a photoresist pattern (PR1) is used as shown in FIG. 1 to form an extended drain structure. The photoresist pattern (PR1) covers parts of the gate electrode 16 and drain region, and extends, in a horizontal direction on the substrate, to a predetermined distance, g, from the edge of the sidewall spacer 18 near to the drain region. As a result, the highly doped drain region 24 is formed to be distant by distance, g, from the gate electrode 16.

As explained above, the conventional extended drain MOS transistor has the highly doped drain region 24 remote from the gate polysilicon 16 for obtaining a breakdown voltage required by a design rule. However, the integration of the MOS transistor in a horizontal direction is degraded as the distance between the highly doped drain region and the gate electrode increases.

SUMMARY OF THE INVENTION

It is an object of the present invention to assure a breakdown voltage required by a design rule, while improving integration in a horizontal direction.

In a first aspect, embodiments of the present invention are directed to a MOS transistor having an extended drain structure and comprising: a semiconductor substrate formed in a well of a first conductivity type; a gate insulating layer formed on the substrate; a gate electrode formed on the gate insulating layer; a source region formed in a first portion of the substrate, which is near to one side of the gate insulating layer and the gate electrode; and a drain region formed in a second portion of the substrate, which is near to other side of the gate insulating layer and the gate electrode, where the second portion is recessed from the surface of the substrate by a predetermined depth.

In a second aspect, embodiments of the present invention are directed to a method for fabricating a MOS transistor, comprising the steps of: forming a well of a first conductivity type in a semiconductor substrate; sequentially depositing a gate insulating layer and a gate conducting layer on the substrate; forming a gate stack by patterning the gate insulating layer and the gate conducting layer; forming a photoresist pattern, which covers the surface of the substrate and opens a portion of the substrate at one side of the gate stack; etching the portion of the substrate, which is opened by the photoresist pattern, to a predetermined depth to form a recessed region in the substrate; and injecting dopants of second conductivity type into the substrate to form a drain region in the recessed region of the substrate at the one side of the gate stack and to form a source region in surface region of the substrate at another side of the gate stack.

Preferably, the semiconductor substrate is a silicon substrate, the gate conducting layer is made of polysilicon, and the protective layer includes a first silicon oxide layer and a first silicon nitride layer. The first silicon oxide layer is formed on the gate conducting layer and the first silicon nitride layer is formed on the first silicon oxide layer.

These and other aspects of embodiments of the invention will become evident by reference to the following description of embodiments, often referring to the accompanying drawings.

DETAILED DESCRIPTION OF EMBODIMENTS OF THE INVENTION

Hereinafter, preferred embodiments of the present invention will be described with reference to the accompanying drawings.

Figure 1:
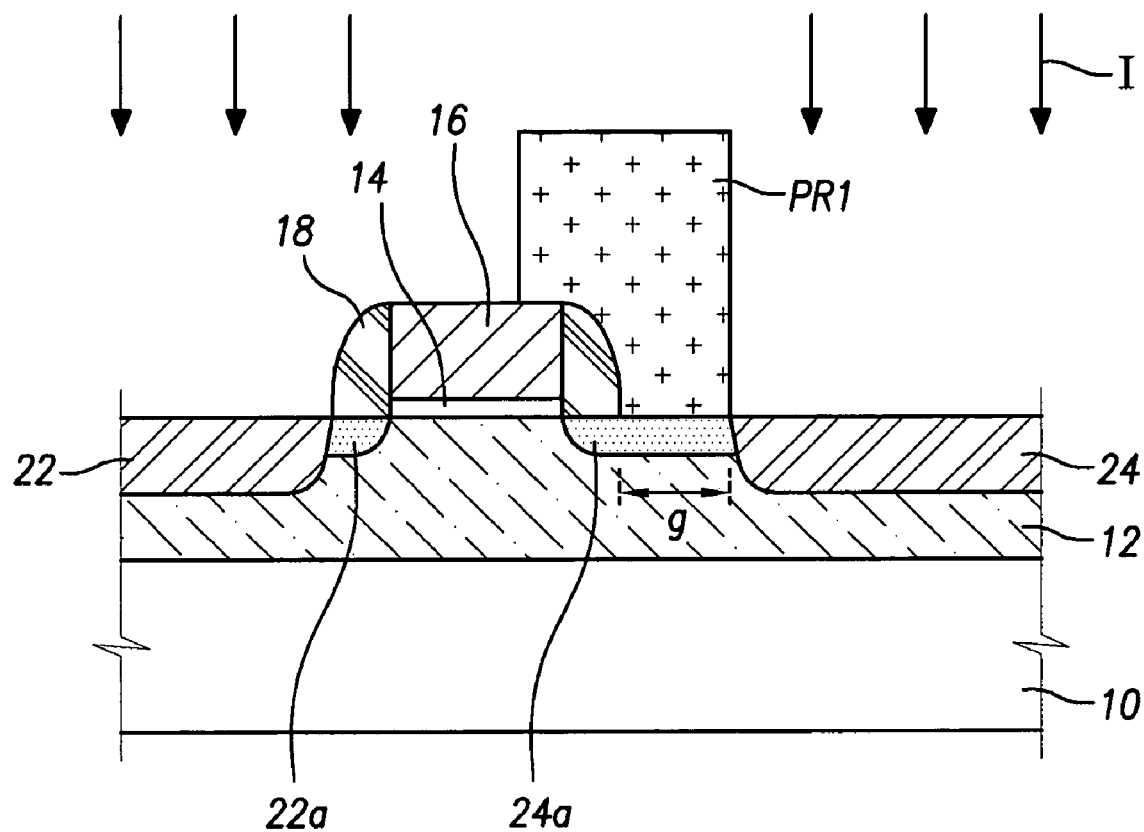
FIG. 1 is a cross-sectional view showing a conventional MOS transistor having an extended drain structure.
Figure 2:
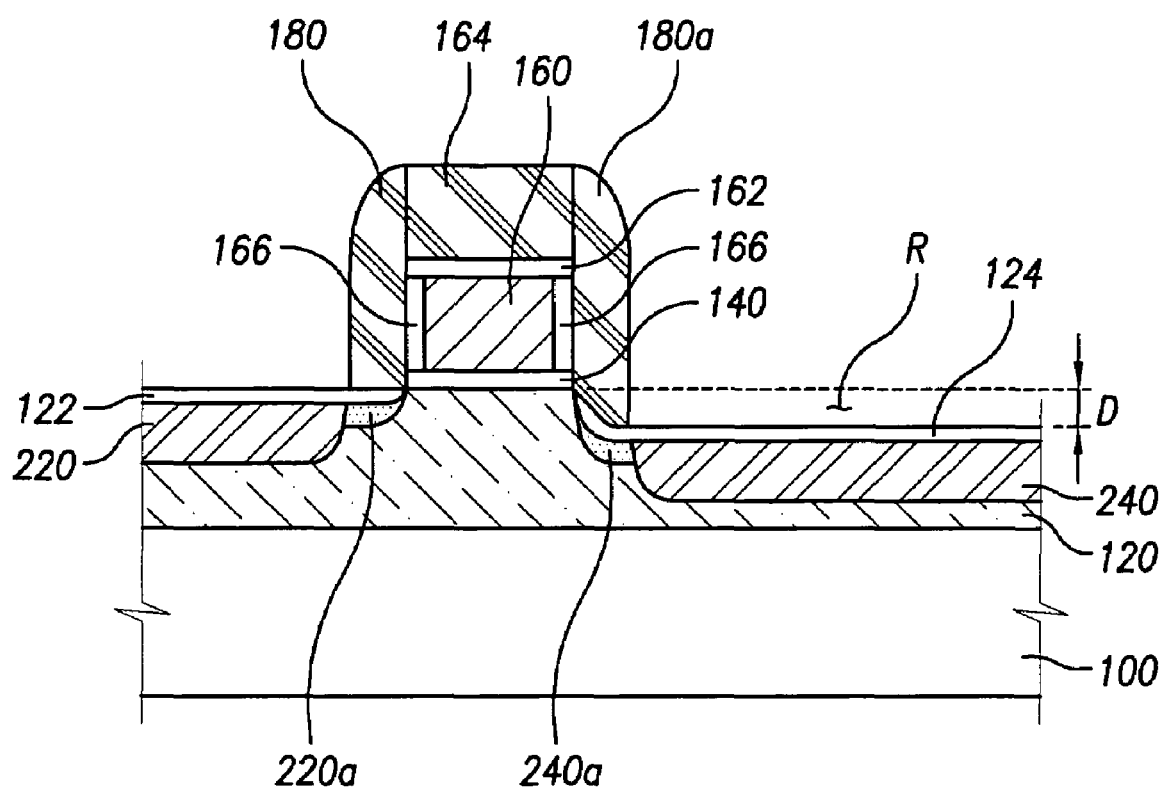
FIG. 2 is a cross-sectional view showing a MOS transistor having an extended drain structure according to the present invention.

Referring to FIG. 2, an extended drain MOS transistor of the present invention is explained. The embodiment of FIG. 2 is N-channel MOS transistor. However, a person of ordinary skill in the art would easily understand that the present invention could be applied to P-channel MOS transistor.

A P-well 120 of a first conductivity type (e.g, boron) is formed in a silicon semiconductor substrate 100. On the substrate 100, a gate electrode 160 of polysilicon and an insulating layer 140 are formed to have a predetermined width. At one side of the insulating layer 140 and the gate electrode 160, a source region 220 of a second conductivity type, which is opposite in charge to the first conductivity type (e.g., phosphorous or arsenic), is formed. At the other side of the insulating layer 140 and the gate electrode 160, a drain region 240 of the second conductivity type is formed. At both sides of the gate electrode 160 and the insulating layer 140, a pair of sidewall spacers 180 and 180a are formed. Under the sidewall spacers 180 and 180a, lightly doped source/drain regions 220a and 240a are formed in the substrate.

According to an embodiment of the present invention, the drain region 240 is formed in a recessed region "R," which is formed by, e.g., etching the substrate 100 to a predetermined depth. Therefore, the drain region 240 is placed lower than the source region 220 by depth "D" from the surface of the substrate 100. With this structure of a recessed drain, the drain is distant, in a vertical direction of the substrate, from the gate electrode 160 and thus the breakdown voltage required by a design rule can be met. Furthermore, in a horizon direction, the drain region 240 has a minimum distance from the gate electrode 160, which leads to highly improved integration in the horizon direction of the substrate when compared to the conventional extended drain MOS transistor.

On the gate electrode 160, a protective layer can be formed. When the gate material is polysilicon, it is preferable to make the protective layer with a silicon oxide layer 162 and a silicon nitride layer 164. The features of the protective layer will be explained below.

FIGS. 3A to 3D are cross-sectional views for illustrating the method for fabricating the extended drain MOS transistor according to the present invention.

Figure 3A:
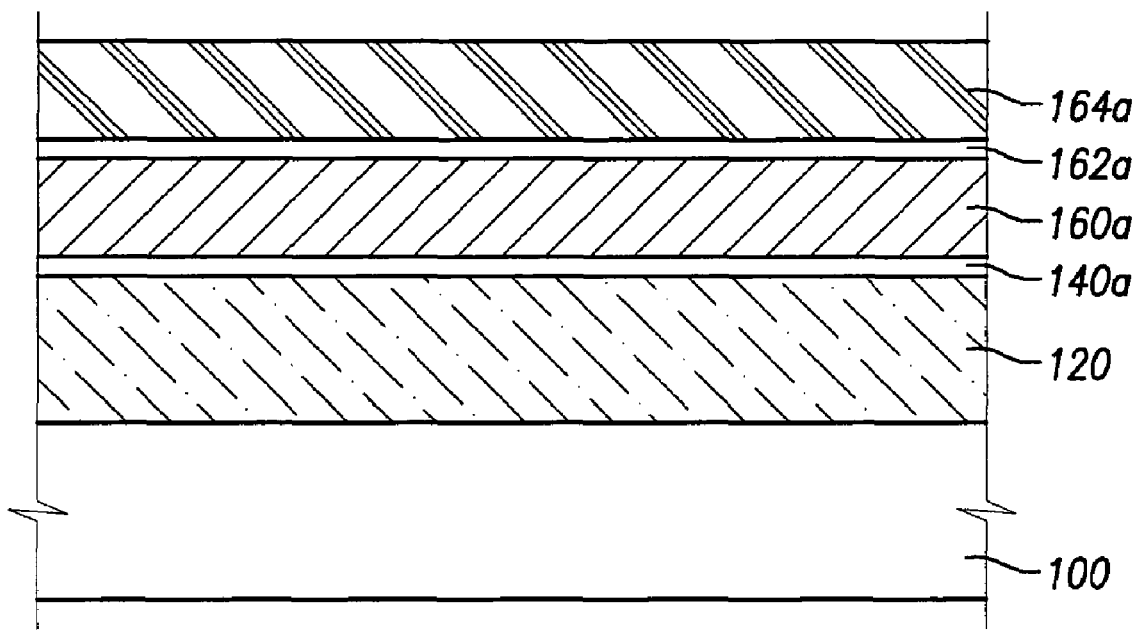
FIGS. 3A to 3D are cross-sectional views for illustrating fabrication methods of an extended drain MOS transistor of the present invention.

Referring to FIG. 3A, gate oxide 140a and polysilicon 160a are deposited on the silicon substrate 100 in which a well 120 of a first conductivity type is formed. In an embodiment, on the polysilicon 160a, silicon oxide 162a and silicon nitride 164a can be deposited for protecting the polysilicon 160a. The silicon nitride 164a is to protect the polysilicon 160a from being etched during the formation of the recessed region "R" as shown in FIG. 3C. The silicon oxide 162a prevents stress from the silicon nitride 164a to the polysilicon 160a.

Figure 3B:
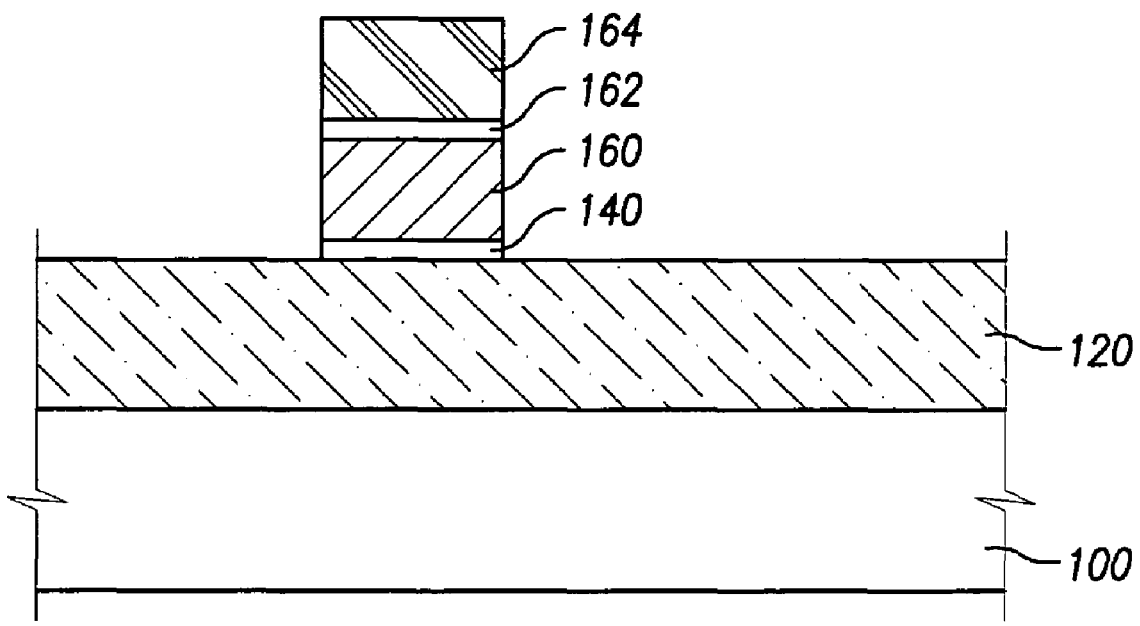
Figure 3C:
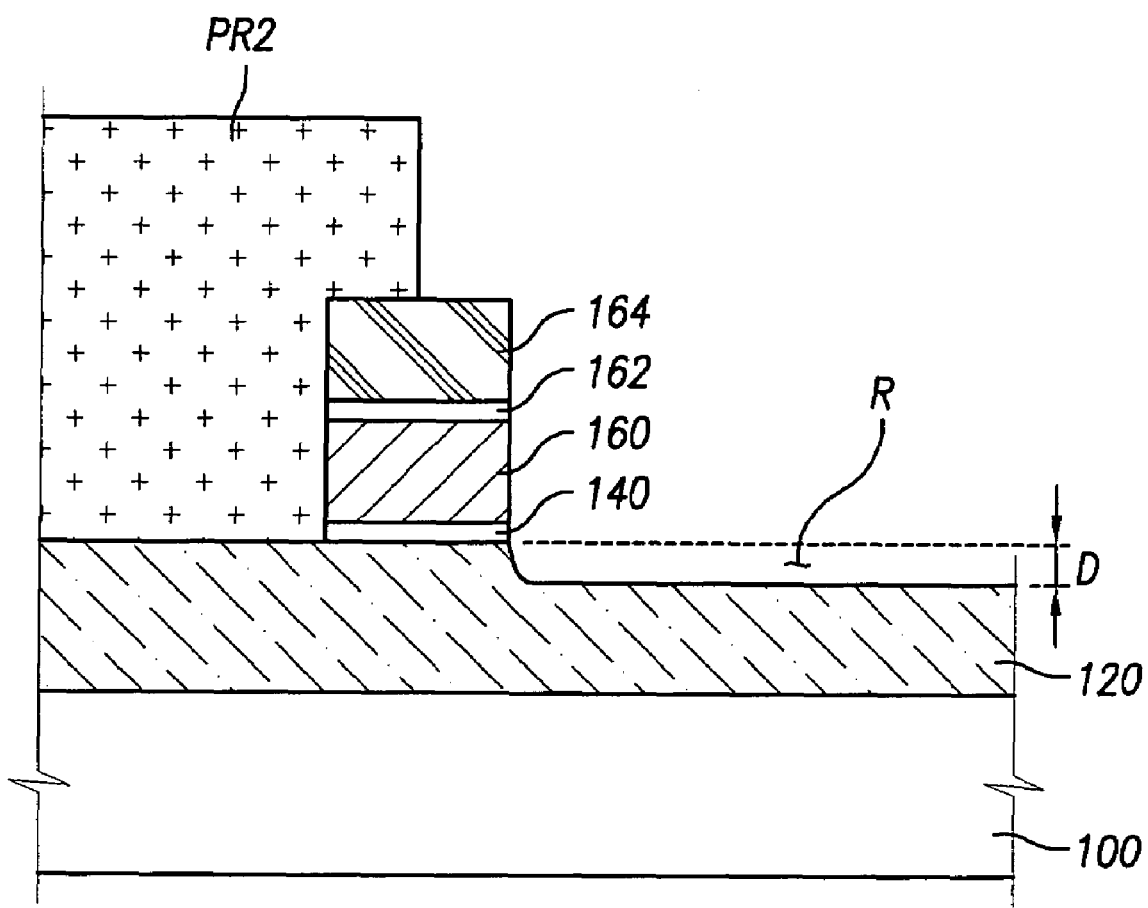

Referring to FIG. 3B, the gate oxide 140a and polysilicon 160a are patterned by a photolithographic process to form a gate stack including the gate oxide layer 140 and gate electrode 160. When the protective materials 162a and 164a are deposited on the polysilicon 160a, they are etched to form protective layers 162 and 164 during the formation of the gate stack.

Referring to FIG. 3C, a photoresist is deposited on the substrate 100 and patterned to open a region of the substrate where the drain is to be formed. Thus, photoresist pattern (PR2) covers the entire surface of the substrate except for the region for a drain. For alignment margin, the photoresist pattern (PR2) can partly cover the top surface of the electrode 160. Since the photoresist pattern (PR2) partly covers the gate electrode 160, the gate electrode can be etched or damaged during the subsequent process for forming the recessed region in the substrate. The silicon nitride layer 164 of the protective layer can prevent the damage of the gate electrode 160.

With the photoresist pattern (PR2) as a mask, the exposed region of the substrate for drain is etched by a predetermined depth "D" to form a recessed region "R". When a wet etching method is employed for the formation of the recessed region, an undercut can occur in the lower portion of the gate electrode 160. Therefore, it is preferable to form the recessed region by a dry etching method.

Figure 3D:
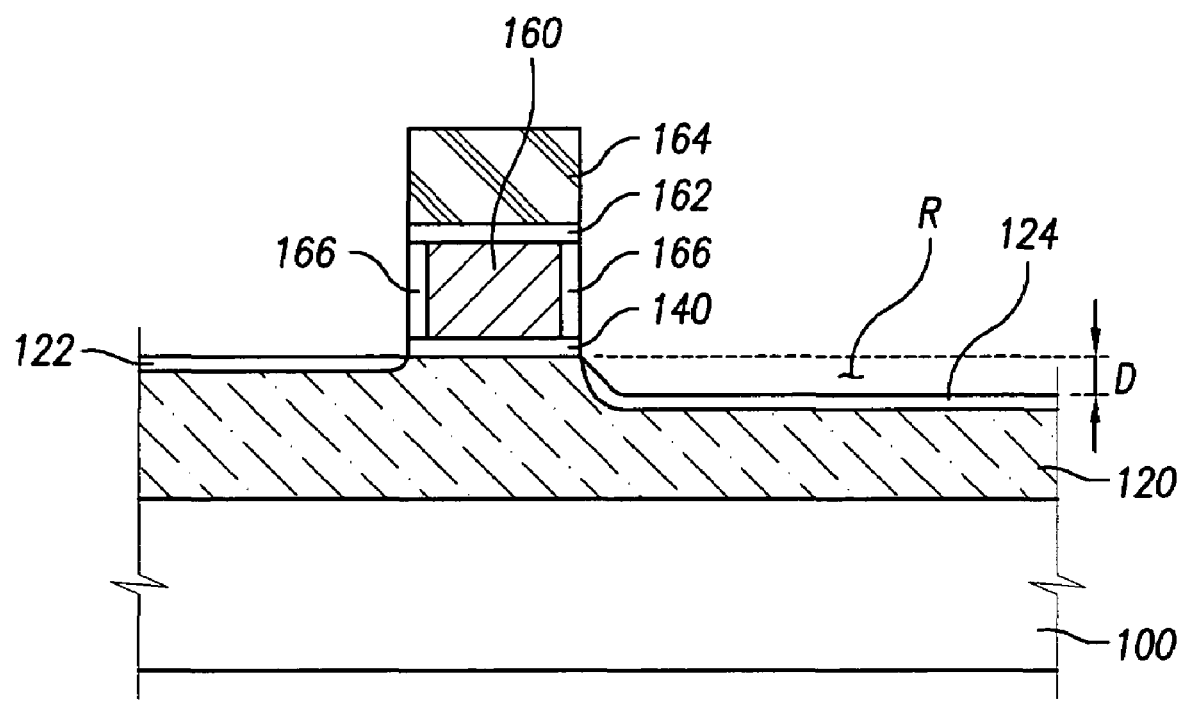

Referring to FIG. 3D, after forming the recessed region, the photoresist pattern (PR2) is removed. Then an oxide layer 166 and oxide layers 122 and 124 are formed on sidewalls of the gate electrode 160 and the surface of substrate, respectively, by, e.g., a thermal oxidation. The sidewall oxide 166 mitigates the concentration of electric fields to lower edges of the gate electrode 160, while the oxide layers 122 and 124 prevent the substrate surface from being damaged by a subsequent ion implantation process.

Subsequently, a first ion implantation process for forming lightly doped source/drain regions, a process for forming sidewall spacers, and a second ion implantation process for forming heavily doped source/drain regions are carried out to form the extended drain MOS transistor structure of FIG. 2.

More specifically, with the gate electrode 160 as a mask, the dopants having lower density and opposite charge to the P-channel well 120 (e.g., phosphorous or arsenic) are injected into the substrate to form a lightly doped source region 220a and a lightly doped drain region 240a.

After forming the regions 220a and 240a, insulating material is deposited on the entire surface of the substrate 100 by LPCVD and the deposited insulating material is selectively etched with leaving at the sidewalls of the gate electrode 160 to form sidewall spacers 180.

With the gate polysilicon 160 and the sidewall spacer 180 as a mask, dopants having higher density and opposite conductivity type to the P-channel well 120 (e.g., phosphorous or arsenic) are injected into the substrate 100 to form heavily doped source/drain regions 220 and 240. In this process, the heavily doped drain region 240 is formed in the recessed region "R." Therefore, the heavily doped drain region 240 has boundary distance from the gate electrode 160, which leads to a MOS transistor having a breakdown voltage required by a design rule. By controlling the depth "D" of the recessed region "R," the distance in a vertical direction from the heavily doped drain region 240 and the gate electrode 160 can be adjusted.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A metal-oxide-semiconductor transistor having an extended drain structure comprising:

a semiconductor substrate having a well of a first conductivity type;

a gate insulating layer formed on the substrate;

a gate electrode formed on the gate insulating layer;

a source region formed in a first portion of the well in the substrate, which is near to one side of the gate insulating layer and the gate electrode;

a drain region formed in a second portion of the well in the substrate, which is near to another side of the gate insulating layer and the gate electrode, said second portion being recessed from the surface of the substrate by a predetermined depth; and an insulating layer formed on the source region, wherein the gate insulating layer is located higher than the insulating layer formed on the source region.

2. The transistor of claim 1 further comprising a pair of insulating sidewall spacers formed at both sides of the gate electrode, to which the source and drain regions are aligned.

3. The transistor of claim 2 further comprising lightly doped source and drain regions.

4. The transistor of claim 1 further comprising a protective layer on the gate electrode.

5. The transistor of claim 4, wherein the semiconductor substrate is a silicon substrate, the gate electrode is made of polysilicon, and the protective layer includes a silicon oxide layer formed on the polysilicon gate electrode and a silicon nitride layer formed on the silicon oxide layer.

6. The transistor of claim 1, wherein the insulating layer formed on the source region is also formed on sidewalls of the gate electrode.

7. A method for fabricating a metal-oxide-semiconductor transistor having an extended drain structure, comprising the steps of:

(A) forming a well of a first conductivity type in a semiconductor substrate;

(B) sequentially depositing a gate insulating layer and a gate conducting layer on the substrate;

(C) forming a gate stack by patterning the gate insulating layer and the gate conducting layer;

(D) forming a photoresist pattern, which covers the surface of the substrate and opens a portion of the substrate at one side of the gate stack;

(E) etching the portion of the substrate, which is opened by the photoresist pattern, to a predetermined depth to form a recessed region in the substrate;

(F) forming an insulating layer on the source region, the insulating layer being located lower than the gate insulating layer; and (G) injecting dopants of a second conductivity type into the well of the substrate to form a drain region in the recessed region of the substrate at said one side of the gate stack and to form a source region in a surface region of the substrate at another side of the gate stack.

8. The method of claim 7, wherein a protective layer is formed on the gate conducting layer in step (B) and the protective layer is etched during step (C).

9. The method of claim 8, wherein the semiconductor substrate is a silicon substrate, the gate conducting layer is made of polysilicon, the protective layer includes a first silicon oxide layer and a first silicon nitride layer, and said first silicon oxide layer is formed on the gate conducting layer and said first silicon nitride layer is formed on the first silicon oxide layer.

10. The method of claim 7, wherein step (G) comprises the steps of:

injecting dopants of the second conductivity type into the substrate at both side of the gate stack to form lightly doped source and drain regions;

forming a pair of insulating sidewall spacers at sidewalls of the gate stack; and injecting dopants of the second conductivity type into the substrate with the pair of insulating sidewall spacers and gate stack as a mask to form highly doped source and drain regions.

11. The method of claim 7, wherein the insulating layer formed in step (F) also formed on the on sidewalls of the gate electrode.

12. The method of claim 11, wherein the insulating layer formed in step (F) is formed by a thermal oxidation process.

* * * * *